(12) United States Patent
Chung

(10) Patent No.: US 8,634,251 B2
(45) Date of Patent: Jan. 21, 2014

(54) PROGRAM METHOD OF SEMICONDUCTOR MEMORY DEVICE

(75) Inventor: Sung Jae Chung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 153 days.

(21) Appl. No.: 13/096,733

(22) Filed: Apr. 28, 2011

(65) Prior Publication Data

US 2011/0267913 A1 Nov. 3, 2011

(30) Foreign Application Priority Data

Apr. 29, 2010 (KR) .............................. 2010-0039895

(51) Int. Cl.
*G11C 11/34* (2006.01)
*G11C 16/06* (2006.01)

(52) U.S. Cl.
USPC ............. 365/185.25; 365/185.17; 365/185.18

(58) Field of Classification Search
USPC ...... 365/185.17 X, 185.18 X, 185.25 O, 204, 365/185.17, 185.18, 185.25
See application file for complete search history.

(56) References Cited

U.S. PATENT DOCUMENTS

| | | | | |
|---|---|---|---|---|
| 6,111,789 A | * | 8/2000 | Choi et al. | 365/185.22 |
| 7,145,806 B2 | * | 12/2006 | Kawai | 365/185.25 |
| 7,408,811 B2 | * | 8/2008 | Shirota et al. | 365/185.25 |
| 7,791,948 B2 | * | 9/2010 | Shirota et al. | 365/185.25 |
| 7,804,712 B2 | * | 9/2010 | Kim et al. | 365/185.03 |
| 2011/0058424 A1 | * | 3/2011 | Goda et al. | 365/185.19 |

FOREIGN PATENT DOCUMENTS

| | | |
|---|---|---|
| KR | 1020090036839 | 4/2009 |
| KR | 1020090069861 | 7/2009 |
| KR | 1020090070739 | 7/2009 |
| KR | 1020090123511 | 12/2009 |

OTHER PUBLICATIONS

Notice of Allowance issued from the Korean Intellectual Property Office on Feb. 9, 2012.

* cited by examiner

*Primary Examiner* — Vanthu Nguyen

(74) *Attorney, Agent, or Firm* — IP & T Group LLP

(57) ABSTRACT

A program method of a semiconductor memory device may include precharging first bit lines, coupled to first strings, to increase a potential level of the first strings to a first potential level; programming memory cells of a selected word line, wherein the memory cells are coupled to second bit lines; pre-discharging the first bit lines to decrease a potential level of the word lines to a second potential level, wherein the second potential level is lower than the first potential level; and discharging the first bit lines and the word lines to a ground voltage after the pre-discharging.

17 Claims, 5 Drawing Sheets

PROGRAM METHOD OF SEMICONDUCTOR MEMORY DEVICE

CROSS-REFERENCE TO RELATED APPLICATION

Priority to Korean patent application number 10-2010-0039895 filed on Apr. 29, 2010, the entire disclosure of which is incorporated by reference herein, is claimed.

BACKGROUND

Exemplary embodiments relate to a method of discharging unselected strings when a program operation is performed.

FIG. 1 is a circuit diagram of a memory block.

A semiconductor memory device includes a memory cell array for storing data. The memory cell array includes a plurality of memory blocks. A memory block is described below in detail as an example.

The memory block includes a plurality of cell strings ST. Each of the cell strings ST includes a drain selection transistor DST, a source selection transistor SST, and a plurality of memory cells F0 to Fn coupled in series between the drain selection transistor DST and the source selection transistor SST. The drain of the drain selection transistor DST is coupled to a bit line BL, and the source of the source selection transistor SST is coupled to a common source line CSL. The gates of the drain selection transistors DST included in the respective strings ST are interconnected to form a drain selection line DSL, and the gates of the source selection transistors SST included in the respective strings ST are interconnected to form a source selection line SSL. The gate electrodes of the memory cells F0 to Fn included in the respective strings ST are interconnected to form a plurality of word lines WL0 to WLn.

FIG. 2 is a timing diagram illustrating a conventional program operation.

Referring to FIGS. 1 and 2, the program operation includes a precharge period in which a bit line is precharged, a channel boost period in which the channel voltage level of a string is raised, a program period in which the threshold voltages of selected memory cells are raised, and a discharge period in which a channel and bit lines are discharged.

At a point of time T1 when the precharge period starts, a precharge-inhibition voltage is supplied to an unselected bit line Unsel_BL. The precharge-inhibition voltage may be a power supply voltage Vcc. Although not shown, a voltage 0V of a ground voltage level is supplied to a selected bit line.

At a point of time T2, when the voltage of the unselected bit line Unsel_BL reaches the power supply voltage (Vcc) level, the drain selection transistor DST is turned on by supplying the power supply voltage to the drain selection line DSL. Thus, the power supply voltage Vcc supplied to the unselected bit line Unsel_BL is transferred to unselected strings and thus increases a potential level difference in the channel of the unselected strings (hereinafter referred to as a 'channel potential'). As described above, the voltage transferred from the unselected bit lines Unsel_BL to the unselected strings is the power supply voltage. Accordingly, at a point of time T3 when the voltage of the drain selection line DSL reaches the power supply voltage (Vcc) level, the channel potential may rise up to a first voltage Vch1 of the power supply voltage (Vcc) level.

At a point of time T4 when the channel boost period starts, a pass voltage Vpass is supplied to a selected word line Sel_WL and unselected word lines Unsel_WL. When the pass voltage Vpass is supplied to the selected word line Sel_WL and the unselected word lines Unsel_WL, the channel potentials of the unselected strings rise owing to coupling between the word line and the channel and thus become a second voltage Vch2 higher than the first voltage Vch1. This is called channel boosting. Meanwhile, the channel boosting does not occur in a selected string coupled to a selected bit line to which a ground voltage is supplied.

At a point of time T5 when the program period starts, the program operation for raising the threshold voltages of selected memory cells included in a selected string is performed by supplying a program voltage Vpgm to the selected word line Sel_WL.

At a point of time T6 when the discharge period starts, the voltage supplied to all the word lines Sel_WL and Unsel_WL is lowered to a ground voltage level. That is, all the word lines Sel_WL and Unsel_WL are discharged. Here, the channel potential is also lowered with a reduction of the coupling between the word line and the channel.

At a point of time T7, the voltage supplied to all the word lines Sel_WL and Unsel_WL has dropped to the ground voltage level. However, the power supply voltage continues to be supplied from the unselected bit lines Unset_BL and the drain selection transistor DST remains turned on. Accordingly, the channel potential becomes lower than the level when the channel boosting occurred, but can maintain a level higher than the ground voltage level 0V.

At a point of time T8, the voltages supplied to the drain selection line DSL and the unselected bit lines Unsel_BL are lowered from the power supply voltage (Vcc) level to the ground voltage level. At this time, the channel potential is to be preferably lowered to the ground voltage level. However, if the drain selection line DSL is discharged and thus the drain selection transistor DST is turned off before the channel potential drops to the ground voltage level, the string becomes in a floating state with a voltage Vr remaining in the channel. In this case, a subsequent verification operation may not be accurately performed, thereby disturbing a normal program operation.

The time taken for the discharge period may be increased for the normal program operation. However, this method may increase the total operating time.

BRIEF SUMMARY

Exemplary embodiments relate to a method of normally discharging unselected strings when a program operation is performed.

A program method of a semiconductor memory device according to an aspect of the present disclosure includes precharging first bit lines, coupled to first strings, to increase a potential level of the first strings to a first potential level; programming memory cells of a selected word line, wherein the memory cells are coupled to second bit lines; pre-discharging the first bit lines to decrease a potential level of the word lines to a second potential level, wherein the second potential level is lower than the first potential level; and discharging the first bit lines and the word lines to a ground voltage after the pre-discharging.

A program method of a semiconductor memory device according to another aspect of the present disclosure includes precharging first bit lines, coupled to first strings, to increase a potential level of the first strings to a first potential level; programming memory cells of a selected word line, wherein the memory cells are coupled to second bit lines; first discharging the first bit lines to decrease a potential level of the word lines to a second potential level, wherein the second potential level is lower than the first potential level; and second discharging a common source line and the word lines to the ground voltage after the first discharging.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1:
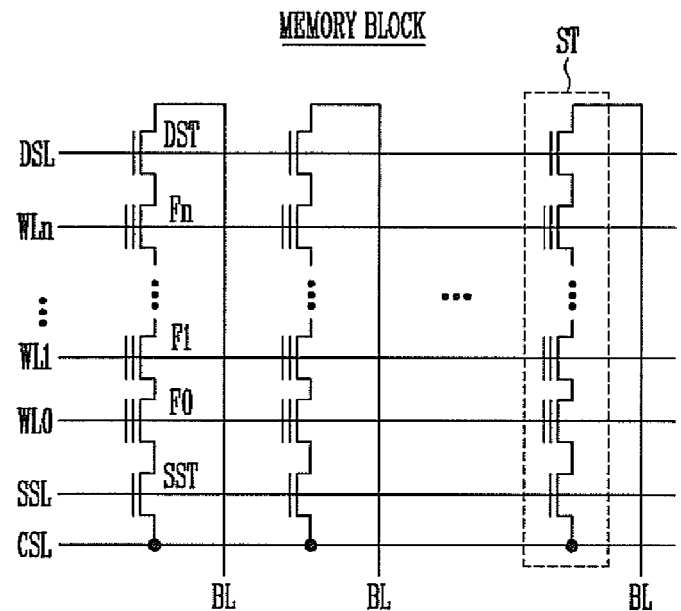
FIG. 1 is a circuit diagram of a memory block.
Figure 2:
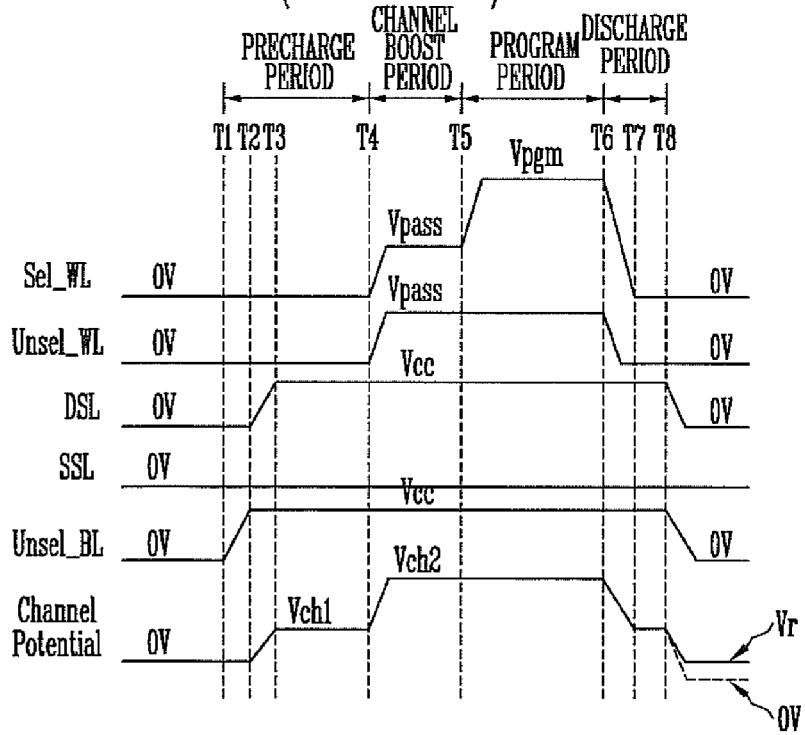
FIG. 2 is a timing diagram illustrating a conventional program operation.
Figure 3:
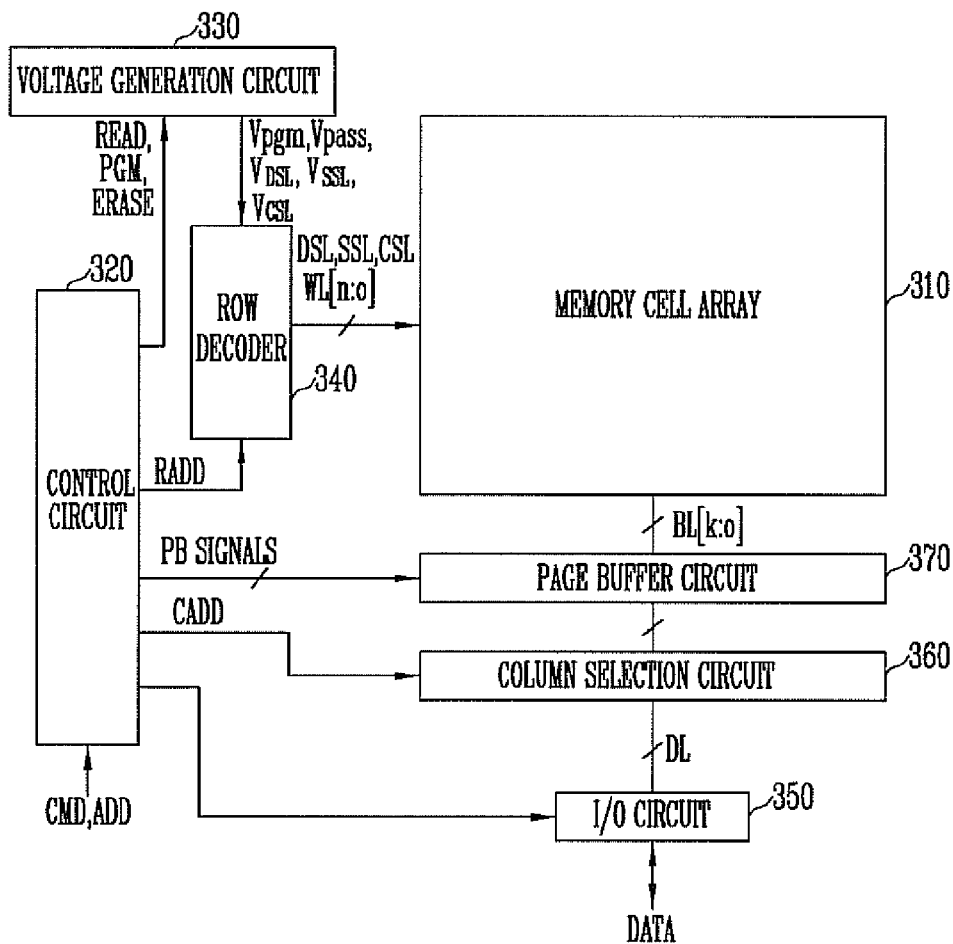
FIG. 3 is a block diagram of a semiconductor memory device according to an exemplary embodiment of this disclosure.

FIG. 3 is a block diagram of a semiconductor memory device according to an exemplary embodiment of this disclosure.

The semiconductor memory device includes a memory cell array 310, a control circuit 320, a voltage generation circuit 330, a row decoder 340, an I/O circuit 350, a column selection circuit 360, and a page buffer circuit 370.

The memory cell array 310 includes a plurality of memory blocks for storing data. The memory blocks are described in detail below with reference to FIG. 5.

The control circuit 320 internally generates a program operation signal PGM, a read operation signal READ, or an erase operation signal ERASE in response to a command signal CMD and generates control signals PB SIGNALS for controlling the page buffers of the page buffer circuit 370 according to the type of the operation. The control circuit 320 internally generates a row address signal RADD and a column address signal CADD in response to an address signal ADD.

A voltage supply circuit supplies operation voltages for the program operation, erase operation, and read operation of memory cells to a selected memory block in response to the signals READ, PGM, ERASE, and RADD of the control circuit 320. The voltage supply circuit consists of the voltage generation circuit 330 and the row decoder 340.

The voltage generation circuit 330 generates a program voltage Vpgm for programming the memory cells, a pass voltage Vpass, a drain selection voltage $V_{DSL}$, a source selection voltage $V_{SSL}$, and a common source voltage $V_{CSL}$ in response to the internal command signals of the control circuit 320 (i.e., the operation signals PGM, READ, and ERASE). The voltage generation circuit 330 also generates the operation voltages for the read operation and the erase operation of the memory cells.

The row decoder 340 transfers the operation voltages, generated by the voltage generation circuit 330, to a memory block selected from among the memory blocks of the memory cell array 310 in response to the row address signal RADD of the control circuit 320. That is, the operation voltages are supplied to the local lines DSL, SSL, CSL, and WL[n:0] of a selected memory block.

The page buffer circuit 370 includes the page buffers (not shown) coupled to the respective bit lines BL[K:0]. The page buffer circuit 370 supplies voltages for storing data in selected cells (e.g., a program-inhibition voltage and a ground voltage) to the respective bit lines BL[K:0] in response to the control signals PB SIGNALS of the control circuit 320.

The column selection circuit 360 selects the page buffers of the page buffer circuit 370 in response to the column address signal CADD of the control circuit 320. Data latched in page buffers selected by the column selection circuit 360 is outputted.

The I/O circuit 350 transfers data to the column selection circuit 360 under the control of the control circuit 320 in order to input external input data to the page buffers of the page buffer group 350 when a program operation is performed. When the data transferred to the column selection circuit 360 is sequentially inputted to the page buffers of the page buffer group 350, the page buffers store the input data in their internal latches.

Figure 4:
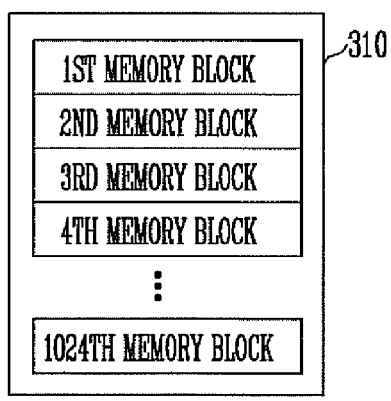
FIG. 4 is a block diagram of a memory cell array shown in FIG. 3.

FIG. 4 is a block diagram of the memory cell array shown in FIG. 3.

The memory cell array 310 includes the plurality of memory blocks. For example, in the case where the memory cell array 310 includes 1024 memory blocks, the first to $1024^{th}$ memory blocks are coupled in series and included in the memory cell array 310.

Figure 5:
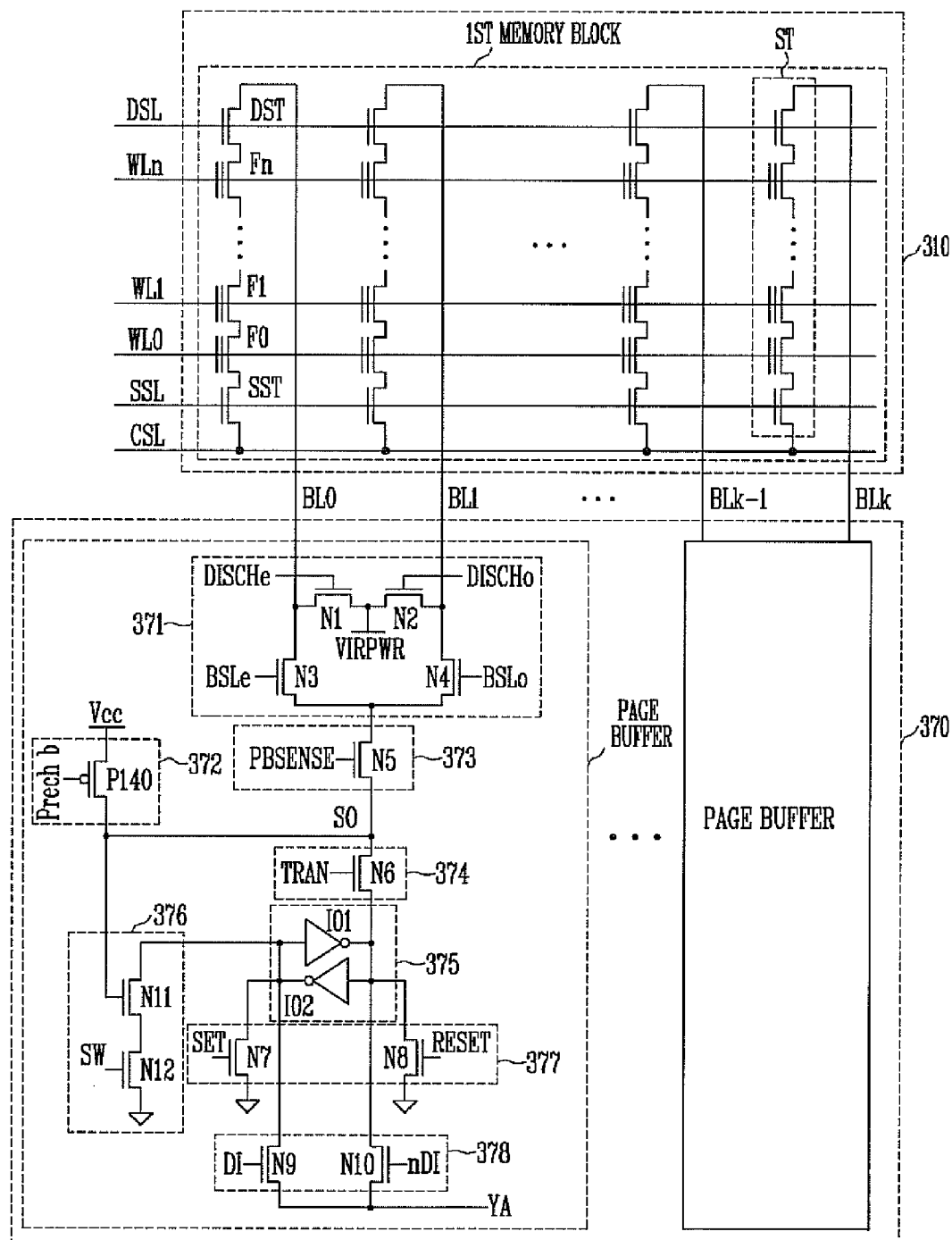
FIG. 5 is a circuit diagram of a memory cell array and a page buffer circuit.

FIG. 5 is a circuit diagram of the memory cell array and the page buffer circuit.

The memory cell array 310 includes the plurality of memory blocks. As an example, a first memory block of the memory blocks is described in detail below. The first memory block includes a plurality of cell strings ST. Each of the cell strings ST includes a drain selection transistor DST, a source selection transistor SST, and a plurality of memory cells F0 to Fn coupled in series between the drain selection transistor DST and the source selection transistor SST. The drains of the drain selection transistors DST are coupled to respective bit lines BL0 to BLk, and the sources of the source selection transistors SST are coupled to a common source line CSL. The gates of the drain selection transistors DST included in the respective strings ST are interconnected to form a drain selection line DSL, and the gates of the source selection transistors SST included in the respective strings ST are interconnected to form a source selection line SSL. The gate electrodes of the memory cells F0 to Fn included in the respective strings ST are interconnected to form a plurality of word lines WL0 to WLn.

The page buffer circuit 370 includes the plurality of page buffers. The page buffers have the same construction, and thus a page buffer coupled to zeroth and first bit lines BL0 and BL1, from among the page buffers, is described in detail below.

The page buffer includes a bit line selection circuit 371, a precharge circuit 372, a sense switch circuit 373, a voltage transfer circuit 374, a latch 375, a sense node detection circuit 376, a set/reset circuit 377, and a data transmission circuit 378. FIG. 5 illustrates a basic page buffer, where the page buffer may have a different construction according to the construction of a semiconductor memory device. The circuits of the page buffer are described in detail below.

The bit line selection circuit 371 includes first and second switches N1 and N2 coupled in series between the zeroth and first bit lines BL0 and BL1, a third switch N3 coupled between the zeroth bit line BL0 and the sense switch circuit 373, and a fourth switch N4 coupled between the first bit line BL1 and the sense switch circuit 373. A virtual voltage VIRPWR is supplied to a node between the first and second switches N1 and N2. The virtual voltage VIRPWR is selected from among a power supply voltage Vcc and a ground voltage. The first to fourth switches N1 to N4 may be implemented using an NMOS transistor. The first switch N1 transfers the virtual voltage VIRPWR to the zeroth bit line BL0 in response to an even discharge signal DISCHe. The second switch N2 transfers the virtual voltage VIRPWR to the first bit line BL1 in response to an odd discharge signal DISCHo. That is, the first switch N1 discharges the zeroth bit line BL0 in response to the even discharge signal DISCHe, and the second switch N2 discharges the first bit line BL1 in response to the odd discharge signal DISCHo. The third switch N3 connects the zeroth bit line BL0 and the sense switch circuit 373 in response to an even bit line selection signal BSLe. The fourth switch N4 connects the first bit line BL1 and the sense switch circuit 373 in response to an odd bit line selection signal BSLo.

The precharge circuit 372 functions to precharge a sense node SO and may include a PMOS transistor P140 coupled between the sense node SO and a terminal from which the power supply voltage Vcc is supplied. The PMOS transistor P140 precharges the sense node SO in response to a precharge signal Prech b.

The sense switch circuit 373 includes a fifth switch N5 responding to a sense signal PBSENSE. When the sense signal PBSENSE of a high level is inputted, the fifth switch N5 connects the sense node SO and a bit line selected by the bit line selection circuit 371.

The voltage transfer circuit 374 includes a sixth switch N6 connecting the sense node SO and the latch 375 in response to a transfer signal TRAN.

The latch 375 stores external or internal input data.

The sense node detection circuit 376 includes eleventh and twelfth switches N11 and N12 coupled in series between the latch 375 and a ground terminal Vss. The eleventh switch N11 is operated in response to the potential of the sense node SO, and the twelfth switch N12 is operated in response to a switch signal SW. When the potential of the sense node SO is in a high level and the switch signal SW is in a high level, both the eleventh and twelfth switches N11 and N12 are turned on.

The set/reset circuit 377 includes seventh and eighth switches N7 and N8 for setting and resetting the latch 375 in response to a set signal SET and a reset signal RESET, respectively.

The data transmission circuit 378 includes ninth and tenth switches N9 and N10 for inputting data, received from an I/O terminal YA, to the latch 375 in response to I/O signals DI and nDI, respectively.

Figure 6:
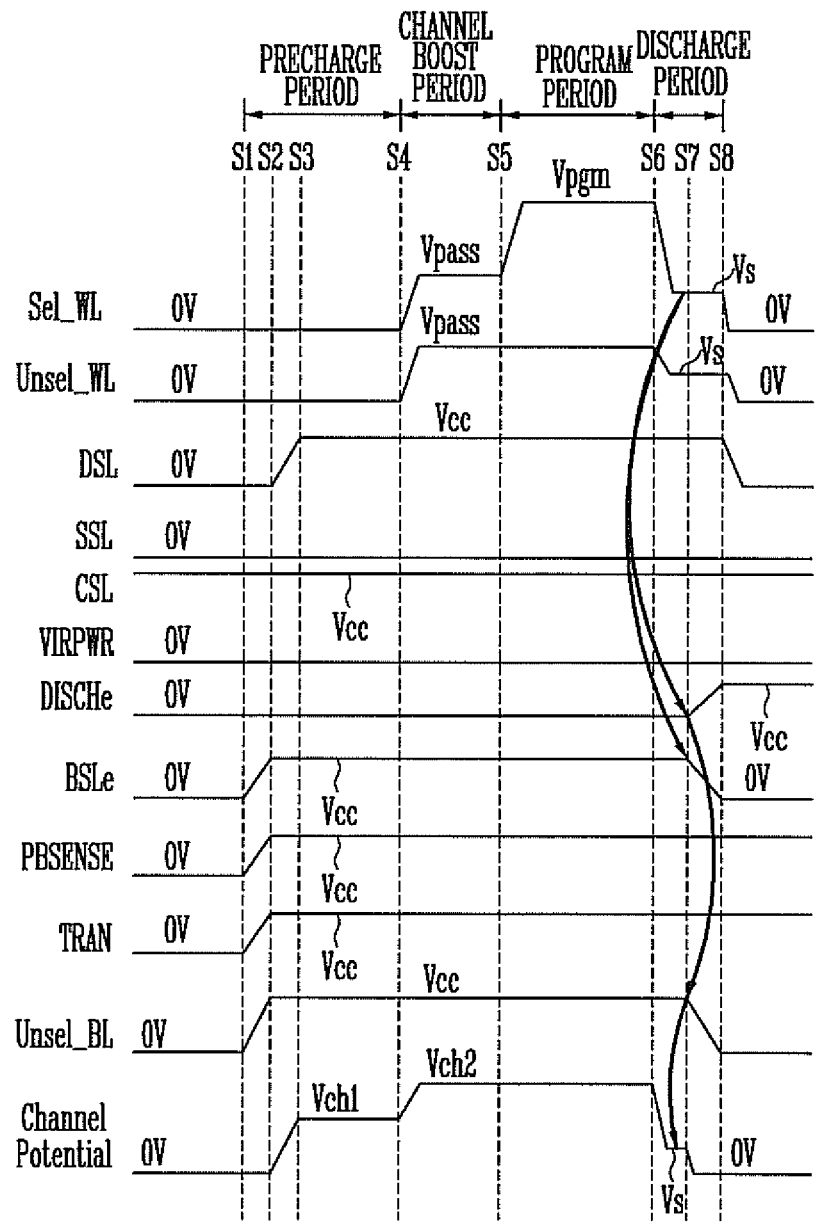
FIG. 6 is a timing diagram illustrating a program operation according to an exemplary embodiment of this disclosure.

FIG. 6 is a timing diagram illustrating a program operation according to an exemplary embodiment of this disclosure.

The program operation is described below with reference to FIGS. 5 and 6.

The program operation includes a precharge period S1 to S4 in which unselected bit lines are precharged, a channel boost period S4 to S5 in which the channel voltage of unselected strings is raised, a program period S5 to S6 in which selected memory cells are programmed, and a discharge period S6 to S8 in which the strings are discharged.

At the point of time S1 when the precharge period starts, in order to connect the bit lines and the latch (375 of FIG. 5) of the page buffer, the even bit line selection signal BSLe, the sense signal PBSENSE, and the transfer signal TRAN of a high level are supplied to the third switch N3, the fifth switch N5, and the sixth switch N6, respectively. Since program data is latched in each of the latches of the page buffers, selected bit lines are discharged and unselected bit lines are precharged according to the data stored in the latch. For example, if data of '1' is inputted to the latch, the potential of the output node of the first inverter I01 of the latch (375 of FIG. 5) becomes the power supply voltage Vcc. Accordingly, in the case where the data stored in the latch is '1', a bit line coupled to the latch is an unselected bit line and thus precharged to the power supply voltage (Vcc) level. The power supply voltage Vcc supplied to the unselected bit lines as described above is also called a program-inhibition voltage.

The ground voltage is supplied to the word lines Sel_WL and Unsel_WL, the drain selection line DSL, and the source selection line SSL. The power supply voltage Vcc is supplied to the common source line CSL. The ground voltage may be supplied to the common source line CSL when a program operation is performed. However, the power supply voltage Vcc is preferably supplied to the common source line CSL in order to prevent the channel voltage of a string from dropping when leakage current is generated in the source selection transistor SSL. The virtual voltage VIRPWR maintains the ground voltage, and the even discharge signal DISCHe remains in a low level in order to prevent the virtual voltage VIRPWR form being supplied to the unselected bit line Unsel_BL.

At the point of time S2, when the voltage of the unselected bit line Unsel_BL reaches the power supply voltage (Vcc) level, the power supply voltage Vcc is supplied to the drain selection line DSL, thereby turning on the drain selection transistor DST. When the drain selection transistor DST is turned on, the power supply voltage Vcc is transferred from the unselected bit line Unsel_BL to an unselected string, so that the level of a channel voltage of the unselected string (hereinafter referred to as a 'channel potential') also rises.

At the point of time S3, when the voltage of the drain selection line DSL reaches the power supply voltage (Vcc) level, the channel potential of the unselected string also reaches the level of a first voltage Vch1 corresponding to the power supply voltage Vcc. Here, the level of the first voltage Vch1 may be equal to the power supply voltage (Vcc) level or slightly lower than the power supply voltage Vcc owing to resistance within the string.

At the point of time S4 when the channel boost period starts, a pass voltage Vpass is supplied to all the word lines Sel_WL and Unsel_WL of a selected memory block. When the pass voltage Vpass is supplied to all the word lines Sel_WL and Unsel_WL in the state in which the channel potential of the unselected string maintains the first voltage Vch1, channel boosting in which the channel potential rises because of coupling between the word lines and the channel occurs. That is, the channel potential of the unselected string rises up to a second voltage Vch2.

At the point of time S5 when the program period starts, the threshold voltages of selected memory cells are raised by supplying the program voltage Vpgm to the selected word line Sel_WL in order to program the memory cells. Here, program memory cells included in the unselected string are prevented from being programmed (i.e., program disturbance) because the potential difference between the word line and the channel is lowered owing to the raised channel potential.

At the point of time S6 when the discharge period starts, the voltage supplied to the selected word line Sel_WL and the unselected word lines Unsel_WL is lowered. The voltage supplied to all the word lines Sel_WL and Unsel_WL is preferably lowered, but becomes higher than the ground voltage.

At the point of time S7, when the level of the voltage supplied to the word lines Sel_WL and Unsel_WL drops to the level of a positive voltage Vs (i.e., a target level), the even bit line selection signal BSLe is shifted to a low level in order to prevent the data of the latch from being changed and the even discharge signal DISCHe is shifted to a high level in order to discharge the bit line.

The positive voltage Vs may be identical with the pass voltage Vpass or a voltage lower than the pass voltage Vpass but higher than the ground voltage. The positive voltage Vs preferably has a certain level not enough to program the memory cells but sufficient enough to maintain the channel in the string. The positive voltage Vs may be generated by the voltage generation circuit 330 of FIG. 3. When the level of the voltage supplied to the word lines Sel_WL and Unsel_WL drops to the positive voltage (Vs) level, coupling between the word line and the channel is reduced, and thus the channel potential also drops to the positive voltage Vs.

In the bit line selection circuit 371, the third switch N3 is turned off and the first switch N1 is turned on. When the first switch N1 is turned on, the virtual voltage VIRPWR of a low level is supplied to the unselected bit line Unsel_BL, so that the unselected bit line Unsel_BL is discharged.

When the unselected bit line Unsel_BL is discharged, the unselected string is discharged because the drain selection transistor DST is also turned on. Here, all the strings can be discharged because the channel is formed in all the strings by the positive voltage Vs supplied to the word lines Sel_WL and Unsel_WL. Accordingly, the channel potentials of the unselected strings can be lowered to the ground voltage.

When the voltage of the word lines Sel_WL and Unsel_WL is lowered during the period S6 to S7, the program voltage Vpgm or the pass voltage Vpass may be lowered to the positive voltage Vs at once or may be lowered incrementally in two or more steps.

At the point of time S8, when the unselected bit lines Unsel_BL are fully discharged, both the drain selection line DSL and the word lines Sel_WL and Unsel_WL are discharged. Next, a program verification operation is performed.

Figure 7:
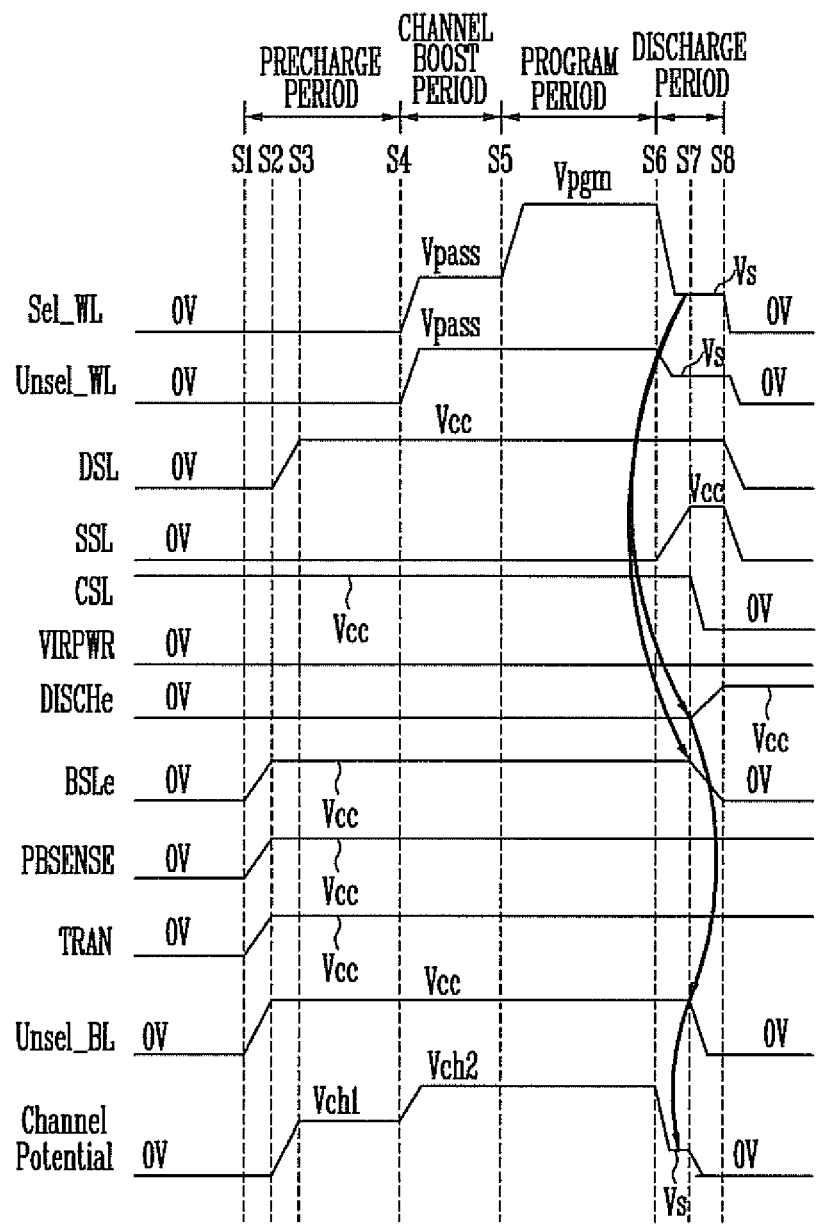
FIG. 7 is a timing diagram illustrating a program operation according to another exemplary embodiment of this disclosure.

FIG. 7 is a timing diagram illustrating a program operation according to another exemplary embodiment of this disclosure.

The program operation is described below with reference to FIGS. 5 and 7.

The program operation includes a precharge period S1 to S4 in which unselected bit lines are precharged, a channel boost period S4 to S5 in which the channel voltage of unselected strings is raised, a program period S5 to S6 in which selected memory cells are programmed, and a discharge period S6 to S8 in which the strings are discharged.

At the point of time S1 when the precharge period starts, in order to connect the bit lines and the latch (375 of FIG. 5) of the page buffer, the even bit line selection signal BSLe, the sense signal PBSENSE, and the transfer signal TRAN of a high level are supplied to the third switch N3, the fifth switch N5, and the sixth switch N6, respectively. Since program data is latched in each of the latches of the page buffers, selected bit lines are discharged and unselected bit lines are precharged according to the data stored in the latch. For example, if data of '1' is inputted to the latch, the potential of the output node of the first inverter 101 of the latch (375 of FIG. 5) becomes the power supply voltage Vcc. Accordingly, in the case where the data stored in the latch is '1', a bit line coupled to the latch is an unselected bit line and thus precharged to the power supply voltage (Vcc) level. The power supply voltage Vcc supplied to the unselected bit lines as described above is also called a program-inhibition voltage.

The ground voltage is supplied to the word lines Sel_WL and Unsel_WL, the drain selection line DSL, and the source selection line SSL. The power supply voltage Vcc is supplied to the common source line CSL. The ground voltage may be supplied to the common source line CSL when a program operation is performed. However, the power supply voltage Vcc is preferably supplied to the common source line CSL in order to prevent the channel voltage of a string from dropping when leakage current is generated in the source selection transistor SSL. The virtual voltage VIRPWR maintains the ground voltage, and the even discharge signal DISCHe remains in a low level in order to prevent the virtual voltage VIRPWR from being supplied to the unselected bit line Unsel_BL.

At the point of time S2, when the voltage of the unselected bit line Unsel_BL reaches the power supply voltage (Vcc) level, the power supply voltage Vcc is supplied to the drain selection line DSL, thereby turning on the drain selection transistor DST. When the drain selection transistor DST is turned on, the power supply voltage Vcc is transferred from the unselected bit line Unsel_BL to an unselected string, so that the level of a channel voltage of the unselected string (hereinafter referred to as a 'channel potential') also rises.

At the point of time S3, when the voltage of the drain selection line DSL reaches the power supply voltage (Vcc) level, the channel potential of the unselected string also reaches the level of a first voltage Vch1 corresponding to the power supply voltage Vcc. Here, the level of the first voltage Vch1 may be equal to the power supply voltage (Vcc) level or slightly lower than the power supply voltage Vcc owing to resistance within the string.

At the point of time S4 when the channel boost period starts, a pass voltage Vpass is supplied to all the word lines Sel_WL and Unsel_WL of a selected memory block. When the pass voltage Vpass is supplied to all the word lines Sel_WL and Unsel_WL in the state in which the channel potential of the unselected string maintains the first voltage Vch1, channel boosting in which the channel potential rises because of coupling between the word lines and the channel occurs. That is, the channel potential of the unselected string rises up to a second voltage Vch2.

At the point of time S5 when the program period starts, the threshold voltages of selected memory cells are raised by supplying the program voltage Vpgm to the selected word line Sel_WL in order to program the memory cells. Here, program memory cells included in the unselected string are prevented from being programmed (i.e., program disturbance) because the potential difference between the word line and the channel is lowered owing to the raised channel potential.

At the point of time S6 when the discharge period starts, the level of the voltage supplied to the selected word line Sel_WL and the unselected word lines Unsel_WL is lowered to a positive voltage Vs. The source selection transistor SST is turned on by supplying the power supply voltage Vcc to the source selection line SSL in the state in which the power supply voltage Vcc is supplied to the common source line CSL.

When the level of the voltage supplied to the word lines Sel_WL and Unsel_WL is lowered, the channel potential of the unselected string is also lowered. That is, when the level of the voltage supplied to the word lines Sel_WL and Unsel_WL is lowered to the positive voltage Vs, the channel potential can also be lowered because of coupling between the word line and the channel.

The voltage supplied to the word lines Sel_WL and Unsel_WL may reach the positive voltage Vs at the point of time S7. However, for the stability of the operation, the voltage supplied to the word lines Sel_WL and Unsel_WL may reach the positive voltage Vs. After a period of delay from the point of time that the positive voltage is reached, an operation corresponding to the point of time S7 be performed.

At the point of time S7, after the level of the voltage supplied to the word lines Sel_WL and Unsel_WL is lowered to the positive voltage Vs, the even bit line selection signal BSLe is shifted to a low level, and the even discharge signal DISCHe is shifted to a high level. Accordingly, in the bit line selection circuit 371, the third switch N3 is turned off and the first switch N1 is turned on. When the first switch N1 is turned on, the virtual voltage VIRPWR of a low level is supplied to the unselected bit line Unsel_BL and thus the unselected bit line Unsel_BL is discharged. When the level of the voltage supplied to the word lines Sel_WL and Unsel_WL is lowered to the level of the positive voltage Vs, the common source line CSL and the unselected bit line Unsel_BL may be discharged. That is, the discharge speed can be increased and all the strings can be uniformly discharged by discharging both the common source line CSL and the unselected bit lines Unsel_BL in the state in which both the drain selection transistor DST and the source selection transistor SST are turned on. Consequently, the channel potentials of strings can be lowered to the ground voltage. All the strings can be uniformly discharged because the channel is formed in all the strings by the positive voltage Vs supplied to the word lines Sel_WL and Unsel_WL.

When the level of the voltage supplied to the word lines Sel_WL and Unsel_WL is lowered during the period S6 to S7, the program voltage Vpgm or the pass voltage Vpass may be lowered to the positive voltage Vs at once or may be lowered incrementally in two or more steps. In this case, the potentials of strings can be lowered more stably owing to coupling.

At the point of time 58, when all the common source line CSL and the unselected bit lines Unsel_BL are discharged, the word lines Sel_WL and Unsel_WL, the drain selection line DSL, and the source selection line SSL are discharged at the same time.

In the embodiment described with reference to FIG. 7, the unselected bit line Unsel_BL and the common source line CSL are illustrated to be discharged at the same time at the point of time S7. However, unselected strings may be discharged using only the common source line CSL at the point of time S7 and then fully discharged using the unselected bit lines Unsel_BL at the point of time S8. Next, a program verification operation is performed.

In accordance with the present disclosure, when a program operation is performed, unselected strings can be discharged for a relatively short period of time. Accordingly, the entire operation time can be reduced, and reliability of a subsequent verification operation can be increased.

What is claimed is:

1. A program method of a semiconductor memory device, comprising:
   precharging unselected bit lines, coupled to unselected strings, to a first voltage level;
   programming selected memory cells, included in selected strings, by applying a program voltage to a selected word line among word lines;
   decreasing the program voltage and a voltage of remaining word lines to a second voltage level, wherein the second voltage level is higher than a level of a ground voltage; and
   discharging the unselected bit lines to the ground voltage.

2. The program method of claim 1, wherein the precharging of the unselected bit lines is performed by applying a program-inhibition voltage to the unselected bit lines.

3. The program method of claim 1, wherein the second voltage level is set to form a channel in the unselected strings.

4. The program method of claim 1, wherein the second voltage level is higher than a level of the ground voltage and equal to or lower than that of a pass voltage.

5. The program method of claim 1, wherein the decreasing of the voltage of the word lines and the discharging of the unselected bit lines are performed at once or step by step, respectively.

6. The program method of claim 1, wherein the discharging of the unselected bit lines is performed in a state in which drain selection transistors are turned on.

7. The program method of claim 1, wherein the discharging of the unselected bit lines are performed using a bit line selection circuit of a page buffer coupled to the unselected bit lines, respectively.

8. The program method of claim 7, wherein a virtual power voltage having the ground voltage is applied to the unselected bit lines through the bit line selection circuit when the discharging of the unselected bit lines is performed.

9. The program method of claim 1, wherein the word lines are discharged during or after the discharging of the unselected bit lines.

10. The program method of claim 1, wherein the ground voltage is applied to a common source line after the decreasing of the voltage of the word lines.

11. A program method of a semiconductor memory device, comprising:
    precharging unselected bit lines and a common source line to a first voltage level, wherein the unselected bit lines are coupled to unselected strings;
    programming selected memory cells, included in selected strings, by applying a program voltage to a selected word line;
    decreasing a voltage of word lines including the selected word line to a second voltage level, wherein the second voltage level is lower than the first voltage level;
    discharging the unselected bit lines and the common source line; and
    discharging the word lines.

12. The program method of claim 11, wherein the second voltage level is set to form a channel in the first strings.

13. The program method of claim 11, wherein the second voltage level is higher than a level of the ground voltage, which is equal to or lower than a level of a pass voltage.

14. The program method of claim 11, wherein the decreasing of a voltage of the word lines and the discharging of the unselected bit lines and the common source line are performed at once or step by step, respectively.

15. The program method of claim 11, wherein the discharging of the unselected bit lines and the common source line is performed in a state in which source selection transistors are turned on.

16. The program method of claim 11, wherein the precharging of the unselected bit lines is performed by applying a program-inhibition voltage to the unselected bit lines and a power supply voltage to the common source line.

17. The program method of claim 11, wherein the levels of the common source line, the unselected bit lines, and the word lines are decreased to a level of the ground voltage in a state in which source selection transistors and drain selection transistors are turned on.

* * * * *